(12) United States Patent
Dendorfer et al.

(10) Patent No.: US 10,731,799 B2
(45) Date of Patent: Aug. 4, 2020

(54) LAMP WITH RADIAL MOUNTED COB LED AND INTEGRATED ELECTRONICS

(71) Applicant: LEDVANCE GmbH, Garching bei München (DE)

(72) Inventors: Christian Dendorfer, Eichstät (DE); Thomas Heil, Schernfeld (DE); Heinz Lang, Schernfeld (DE); Bernhard Rieder, Regensburg (DE); Georg Rosenbauer, Wassertrüingen (DE)

(73) Assignee: LEDVANCE GMBH, Garching Bei Munich (DE)

( * ) Notice: Subject to any disclaimer, the term of this patent is extended or adjusted under 35 U.S.C. 154(b) by 0 days.

(21) Appl. No.: 16/034,674

(22) Filed: Jul. 13, 2018

(65) Prior Publication Data
US 2019/0017659 A1     Jan. 17, 2019

(30) Foreign Application Priority Data
Jul. 14, 2017   (DE) .................... 10 2017 115 885

(51) Int. Cl.

| | |
|---|---|
| F21K 9/232 | (2016.01) |
| F21K 9/238 | (2016.01) |
| F21K 9/64 | (2016.01) |
| F21V 3/02 | (2006.01) |
| F21V 23/00 | (2015.01) |
| H01L 33/50 | (2010.01) |
| F21Y 107/00 | (2016.01) |
| F21Y 115/10 | (2016.01) |
| H01L 25/075 | (2006.01) |

(52) U.S. Cl.
CPC .............. *F21K 9/238* (2016.08); *F21K 9/232* (2016.08); *F21K 9/64* (2016.08); *F21V 3/02* (2013.01); *F21V 23/005* (2013.01); *F21V 23/006* (2013.01); *H01L 33/504* (2013.01); *F21Y 2107/00* (2016.08); *F21Y 2115/10* (2016.08); *H01L 25/0753* (2013.01)

(58) Field of Classification Search
CPC . F21K 9/232; F21K 9/238; F21K 9/64; F21K 9/66; F21V 19/003; F21Y 2107/30
See application file for complete search history.

(56) References Cited

U.S. PATENT DOCUMENTS

| | | | | |
|---|---|---|---|---|
| 5,688,042 A | * | 11/1997 | Madadi ..................... | F21V 3/00 362/240 |
| 6,525,668 B1 | * | 2/2003 | Petrick .................. | F21V 21/116 340/473 |
| 9,420,644 B1 | | 8/2016 | Shum | |
| 2012/0014111 A1 | * | 1/2012 | Welten ..................... | F21V 3/00 362/296.08 |

(Continued)

FOREIGN PATENT DOCUMENTS

| | | |
|---|---|---|
| DE | 20214661 U1 | 12/2002 |
| DE | 202010013037 U1 | 2/2011 |

(Continued)

*Primary Examiner* — Julie A Bannan
(74) *Attorney, Agent, or Firm* — Hayes Soloway PC

(57) ABSTRACT

An LED light fixture includes a glass bulb. In the interior of the glass bulb is a driver module and a plurality of lighting elements. The glass bulb completely surrounds the lighting elements radially. The lighting elements are arranged radially around the driver module. The lighting elements may be LED filaments or individual light-emitting diode chips.

6 Claims, 9 Drawing Sheets

(56) References Cited

U.S. PATENT DOCUMENTS

| | | | |
|---|---|---|---|
| 2012/0262066 A1* | 10/2012 | Bakk | F21V 29/004 315/113 |
| 2012/0262903 A1* | 10/2012 | Li | F21K 9/232 362/84 |
| 2013/0077285 A1* | 3/2013 | Isogai | F21V 23/006 362/84 |
| 2013/0148341 A1* | 6/2013 | Williams | F21S 9/022 362/184 |
| 2013/0271972 A1 | 10/2013 | Hussell et al. | |
| 2013/0271981 A1 | 10/2013 | Hussell et al. | |
| 2013/0294092 A1 | 11/2013 | Hussell et al. | |
| 2014/0103794 A1 | 4/2014 | Ueda et al. | |
| 2014/0268802 A1* | 9/2014 | Sun | F21V 5/04 362/294 |
| 2015/0103525 A1* | 4/2015 | Rowley | F21K 9/90 362/249.06 |
| 2015/0109813 A1* | 4/2015 | Birdwell | F21K 9/61 362/555 |
| 2015/0327349 A1 | 11/2015 | Lee et al. | |
| 2015/0345764 A1* | 12/2015 | Hussey | F21V 23/006 362/235 |
| 2016/0348852 A1 | 12/2016 | Kaandorp et al. | |
| 2017/0102112 A1 | 4/2017 | Janik et al. | |
| 2017/0227208 A1* | 8/2017 | Bendtsen | F21V 17/16 |
| 2017/0268730 A1* | 9/2017 | Cai | F21V 3/02 |
| 2018/0328544 A1 | 11/2018 | Rieder et al. | |

FOREIGN PATENT DOCUMENTS

| | | |
|---|---|---|
| JP | 2013222782 A | 10/2013 |
| WO | 2012031533 A1 | 3/2012 |

* cited by examiner

LAMP WITH RADIAL MOUNTED COB LED AND INTEGRATED ELECTRONICS

CROSS-REFERENCE TO RELATED APPLICATIONS AND PRIORITY

This patent application claims priority from German Patent Application No. 102017115885.5 filed Jul. 14, 2017, which is herein incorporated by reference in its entirety.

TECHNICAL FIELD

The present invention relates to a LED light fixture as well as a LED lamp with a LED light fixture.

TECHNICAL BACKGROUND

Because of their high energy efficiency, LED light fixtures for use in LED lamps, in particular in LED retrofit lamps, are growing in popularity as a replacement for conventional light fixtures such as halogen or incandescent lamps. However, by comparison with conventional light fixtures, LED light fixtures have several disadvantages.

Thus, LED light fixtures have a significantly poorer emission characteristic and a reduced lighting quality. Known LED light fixtures have, for example, a flicker at a frequency of 100 Hz. Moreover, the solid angle covered is generally significantly smaller than in conventional light fixtures and/or the radiation is spatially very inhomogeneous. Also, a poor mounting or adjustment of the light modules with the light emitting diode chip inside the LED light fixture can lead to a reduction of the lighting quality.

A further disadvantage is the current size of the LED light fixtures or the LED lamps. Thus, in LED light fixtures, a driver module with an electronic driver is additionally required which is generally accommodated in the base of the LED lamps and/or in connection regions of the LED light fixtures. As a result, conventional LED lamps are designed to be relatively large. The cooling elements necessary for the driver module and/or the light modules are a further reason for cumbersome and expensive LED light fixtures. However, poor cooling reduces the service life of the LED lamp and the lighting quality.

SUMMARY OF THE INVENTION

Starting from the disadvantages described above, it is an object of the present invention to provide a compact LED light fixture which can be produced cost-effectively. Furthermore, a LED lamp with a compact LED light fixture which can be produced cost-effectively should be provided.

These objects are achieved by a LED light fixture and a LED lamp with the features of the independent claims. Advantageous further embodiments are apparent from the dependent claims, the description, the drawings and also the exemplary embodiments described in connection with the drawings.

Accordingly a LED light fixture is specified, comprising a glass bulb, in the interior of which a driver module and a plurality of lighting elements are received. The glass bulb completely surrounds the lighting elements radially. The lighting elements are arranged radially around the driver module.

In the LED light fixture the driver module is introduced into the glass bulb of the LED light fixture jointly with the lighting elements. As a result, the LED light fixture can have an extremely compact construction. In particular, no additional space is necessary outside the glass bulb for the driver module. Due to the arrangement of the lighting elements around the driver module there is no direct view of the driver module, and the driver module is concealed, so to speak, by the lighting element. Due to this arrangement a compact LED light fixture with an aesthetic visual appearance can be provided.

The glass bulb can be a bulb directly encasing the lighting elements or a glass shell spaced apart from the lighting elements. In the case of a glass shell, the glass bulb can have a cylindrical shape and/or the shape of a glass shell of a light bulb. In the event of a bulb directly encasing the lighting elements, the bulb is preferably in direct contact at least at some points with the lighting elements and/or has a cylindrical shape. The bulb can be constructed in the manner of a glass bulb of a conventional halogen lamp. In particular the glass bulb can have the shape of a glass bulb of a bi-pin halogen lamp with a base on one side, such as for example a so-called G4 or a G9 halogen lamp, or a halogen lamp with a base on two sides, such as for example a R7 halogen lamp.

If the glass bulb is designed as a glass shell, the driver module is preferably cast with a gas-impermeable material, in particular a glass, a ceramic and/or a polymer, in order to keep away gas emissions of volatile compounds from the glass bulb. In the case of a glass shell the LED light fixture can be free of a further enclosure, such as for example a glass enclosure. As a result, light losses on further enclosures can be avoided. Moreover, the LED light fixture can be provided in a similar production chain to a conventional halogen lamp. In particular, the LED light fixture can then be constructed as a LED lamp.

The glass bulb is for example of elongate construction and extends along a main axis. The radial direction of the glass bulb extends perpendicularly to the main axis. In particular, the glass bulb has primarily a cylindrical shape, wherein the cylinder has in particular an elliptical base surface. An axis of symmetry of the cylinder, that extends perpendicularly with respect to the base surface, preferably forms the main axis of the glass bulb.

The lighting element can be a light module, a light-emitting diode, in particular with a housing and/or an integrated lens, or one single, inorganic or organic light-emitting diode chip. A light module preferably comprises one, but in particular a plurality of, inorganic or organic light-emitting diode chip(s). A light-emitting diode contains at least one, in particular precisely one, light-emitting diode chip and an enclosure for the light-emitting diode chip. If in what follows an indefinite article such as "a" or "an" is used, a single number or a plurality may be meant, in particular in the context of "at least one" or "one or more" etc., provided that this is not explicitly precluded, such as for example by the expression "precisely one" or "one single", etc.

The driver module can have an electronic driver component. For example, the driver module contains a rectifier circuit which is configured in order to convert AC mains voltage into a DC operating voltage of the LED light fixture. Furthermore, the driver module can comprise a transistor which is configured for current regulation and/or current limitation of the current flowing through the light emitting diode chip. Furthermore, it is possible that the driver module contains at least one integrated circuit. Alternatively or in addition, the driver module can comprise a smoothing capacitor. The smoothing capacitor is configured in order to reduce the 100 Hz flickering of the lighting elements induced by the modulation of the input voltage.

The glass bulb can be formed with tempered glass, soft glass and/or quartz glass. The glass bulb, in particular when the glass bulb is a closely adjacent bulb, is preferably formed with quartz glass and/or tempered glass or consists of at least one of these materials. In this case and in what follows, the term "consists" should be interpreted within the context of production tolerances; that is to say, the glass bulb can have impurities due to manufacturing tolerances. For example, the glass bulb contains at least 99% silicon dioxide. By the use of quartz glass or tempered glass a glass bulb can be provided which can be filled with a gas pressure of up to 30 bars. In contrast to this, a soft glass cannot be filed with high gas pressures (up to a maximum of approximately 1 bar). Furthermore, quartz glass and/or tempered glass have the advantage that these materials are extremely temperature-resistant and, moreover, have very good optical characteristics. Moreover, the thermal conductivity of tempered glass or quartz glass is sufficiently high in order to enable a good dissipation of waste heat generated during operation of the LED light fixture.

Duran glass, aluminosilicate glass and/or borosilicate glass may be considered as tempered glasses. In particular, those glasses which are also used in the construction of conventional halogen lamps are suitable as tempered glasses. In contrast to soft glasses, in which a temperature shock of 100 K can already lead to rupture or cracking of the glass lead, quartz glass and also tempered glass can be exposed to high temperatures, for example up to 1000 K, without ruptures or cracks occurring.

Soda-lime glass in particular may be considered as a soft glass. In particular, if the glass bulb is constructed as a glass shell, the use of soft glass can be advantageous because of the lower costs thereof.

According to one embodiment the LED light fixture has n lighting elements, where n 3, which extend along the main axis of the glass bulb. The lighting elements form the edges of a regular, n-polygonal, imaginary prism, which surrounds the driver module. In a plan view of the LED light fixture the lighting elements can, in particular, form the corners of a n-polygonal regular polygon. Thus, the lighting elements are, in particular, arranged regularly around the driver module. A spacing of adjacent lighting elements relative to one another and a spacing of the lighting elements relative to the driver module are preferably the same for all lighting elements. In particular, the lighting elements surround the driver module in radial directions of the driver module. The spacing of the lighting elements relative to the driver module can then extend along the radial direction.

The lighting elements are preferably arranged, in particular, in relation to the driver module in such a way that a main emission direction of the lighting element extends radially outwards, that is to say away from the driver module, and/or tangentially. In this case the tangential direction is given by a tangent to an imaginary circumference which extends around the lighting elements. The tangential direction extends perpendicularly with respect to the radial direction and to the main axis. The main emission direction extends, in particular, perpendicularly with respect to a main plane of the light-emitting diode chips of the lighting elements.

In particular, it is possible that the main emission direction extends radially outwards, tangentially and/or along an inclination lying between these two directions. Due to such an arrangement of the lighting elements a homogeneous and/or efficient radiation can be achieved. With regard to the thermal aspect of the LED light fixture, mixtures of radial and tangential radiation can likewise be used.

According to an embodiment of the LED light fixture, the lighting elements are LED filaments or individual light-emitting diode chips. A LED filament has an elongated shape, similar to the shape of a glow wire of a conventional incandescent lamp. The light-emitting diode chips of a lighting element designed as a LED filament can be arranged quasi one-dimensionally along a longitudinal direction of the required LED filament.

According to one embodiment the LED light fixture comprises n lighting elements, where n 4, and at least one disc-like mounting with a plurality of recesses. In particular, the LED light fixture comprises an even number of lighting elements. The retainer can for example have an elliptical, circular or polygonal basic shape. Each lighting element has two long ends which form the respective end of the lighting element along the main axis. Each lighting element is retained and electrically contacted on a long end of the lighting element in a respective recess in the holders. In particular, a recess in the holder is assigned uniquely to the respective long end of the lighting elements fastened in the holder. Two adjacent recesses of the holder are electrically conductively connected to one another.

The recesses in the holder are preferably slots in the material of the holder. For example, a printed circuit board and/or a contact of the lighting element is inserted into the slot and clamped there, so that a mechanical fastening of the lighting elements on the holder is produced.

The LED light fixture preferably comprises a first holder and a second holder, which in each case have a plurality of recesses. A first long end of each lighting element can be retained in a respective recess in the first holder and a second long end of each lighting element can be retained in a respective recess in the second holder. The lighting elements can be arranged between the two holders. The two holders can extend substantially parallel to one another. For example, the lighting elements extend substantially perpendicularly with respect to the two holders and/or substantially parallel to one another. The two holders can then in particular have the same diameter. Alternatively, it is possible that the lighting elements for the second holder, which in particular have a greater spacing with respect to a base of the LED light fixture than the first holder, extend conically towards one another. For this purpose, the second holder can for example have a smaller diameter than the first holder. A slightly conical taper can be of assistance, in particular during fitting of the lighting element into the holders. Furthermore, as a result the optical illumination in an upper bulb region of the LED light fixture can be improved.

At least two adjacent recesses of each holder are preferably electrically conductively connected to one another. In particular, two adjacent recesses can be connected to one another in such a way that at least two, in particular precisely two, adjacent lighting elements are connected in series to a lighting element group. The LED light fixture preferably contains at least two lighting element groups. The lighting element groups can be connected in parallel to one another by means of the holder and/or the first and the second holder.

According to an embodiment of the LED light fixture each lighting element has a light-emitting diode chip which is mounted on a first printed circuit board. Alternatively or in addition, the driver module has an electronic driver component which is mounted on a printed circuit board.

In at least one preferred embodiment of the LED light fixture each lighting element is a, in particular precisely one, light-emitting diode chip and is mounted on the first printed circuit board by means of chip-on-board (COB) assembly and/or the driver component of the driver module is mounted on the second printed circuit board by means of chip-on-board assembly. In this case and in the following, the term "chip-on-board assembly" should be understood as the direct assembly of semiconductor chips on a circuit board, in particular using bonding wires. The chip-on-board assembly takes place preferably with semiconductor chips which are not enclosed and/or with so-called chip-scale components, in which the housing exceeds a cross-sectional surface area of a bare semiconductor chip by at most 30%, preferably at most 20%. The use of chip-on-board assembly makes it possible to construct a compact LED light fixture, in particular with a high light yield per available surface, or a compact driver module.

It is also possible that the lighting elements and/or the driver component is mounted by means of surface mounting (surface-mounted device, SMD) and/or by means of pin-through hole (PTH) mounting or by means of a mixed form of the preceding techniques, in particular by means of pin-in-paste mounting on the first printed circuit board or the second printed circuit board. In particular, it is possible that in the LED light fixture chip-on-board assembly can be combined with surface mounting and/or pin-through hole mounting. For example, the lighting elements are mounted by means of chip-on-board assembly, and the driver component is mounted by means of surface mounting, pin-through hole mounting and/or pin-in-paste technology. Furthermore, other driver components can be provided which can be mounted by at least one of the aforementioned mounting types.

According to one embodiment of the LED light fixture, conductive tracks of the first printed circuit board and/or conductive tracks of the second printed circuit board are produced by means of digital direct metal plating. Digital direct metal plating is an additive manufacturing process based on plasma coating technology, ink jet printing and/or screen printing. With this manufacturing process, conductive tracks can be applied directly to any substrate without the use of wet chemical and/or other material-removing processes. Conductive tracks applied in this way can have a small thickness in conjunction with a high current-carrying capacity. Moreover, the digital direct metal plating enables the provision of extremely robust conductive tracks which for example have a high heat resistance and/or scratch resistance.

According to an embodiment of the LED light fixture, the lighting elements are regularly distributed three-dimensionally about the driver module. The lighting element, in particular the light-emitting diode chips of the lighting element, are preferably mounted on a first printed circuit board by a three-dimensional chip assembly (die bonding).

The first printed circuit board can preferably also take on the function of a housing of the driver module. In particular, the first printed circuit board is formed by a material with an increased thermal conductivity or consists of such a material. For example, the following are suitable as such a material: a ceramic, in particular $Al_2O_3$, an oxidized aluminum plate with increased thermal conductivity, anodized and/or anodized standard aluminum, glass, in particular soft glass, tempered glass and/or quartz glass, and/or heat-conducting plastic.

The three-dimensional chip assembly preferably takes place by the use of a conventional two-dimensional chip assembly, in particular with conventional two-dimensional chip-bond equipment and/or with conventional two-dimensional wire bond equipment. This is augmented by a rotating holder unit. A three-dimensionally equipped LED light fixture can be provided by the combination of a two-dimensional assembly and a two-dimensional wire bond process with a rotary machine which enables a rotation of the printed circuit board to be equipped, in particular around the main axis. The printed circuit board to be equipped can, in particular, be attached along an outer surface of a cylindrical or prismatic body.

According to an embodiment, the driver module and/or each lighting element contains a plastic conductor component, wherein an electrically conductive insert part is surrounded, in particular completely, by an electrically insulating plastic housing and forms an electrical contact of a driver component of the driver module and/or of a light-emitting diode chip of the lighting element. The insert part can be formed by a metal (so-called metal inner part) and/or an electrically conductive plastic, in particular an electrically conductive polymer. In the case of a metal inner part the plastic conductor component is a plastic/metal component. In the case of an electrically conductive plastic the plastic conductor component is a plastic/plastic component.

It is possible that the driver component and/or the light-emitting diode chip are likewise at least partially surrounded by the plastic housing. Further components of the driver module and/or of the lighting element, such as for example a lens of the lighting element, can be surrounded by the plastic housing. In a special, particularly preferred embodiment, the driver module and/or the lighting element is free of a printed circuit board. In other words, the plastic conductor component can function as a printed circuit board of the driver module and/or of the lighting element.

The electrically conductive insert part can serve as a contact element for conducting electric current between the lighting elements, between the lighting elements and the driver module and/or between the driver module and current leads out of a base region, in particular the base region of a lamp containing the LED light fixture.

In general, the electrical contacting of the driver component of the driver module and/or the lighting elements can have at least one of the following forms of contact. The electrical contacting can be provided by means of laser welding wires. The laser welding wires can be connected to external supply means and/or internally by means of a laser welding process. The electrical contacting can also take place with plug-in connectors. Furthermore, it is possible that for the electrical contacting a printed circuit board printed with conductive tracks is made available and/or that the electrical contacting means contain a printed circuit. The conductive tracks and/or other electrical contacting means can also be formed at least partially with an electrically conductive polymer. Furthermore, an injection molded circuit carrier (molded interconnected device, MID) can be used for the electrical contacting.

The insert part is preferably embedded in the plastic housing using an injection molding process. For this purpose, the already manufactured insert part, and optionally the driver component and/or the light-emitting diode chip, can be placed into an injection mold and overmolded with the plastic of the plastic housing. This production process is also designated by the name "insert technique". Alternatively, it is possible that the insert part and the plastic housing are produced by means of a two-component injection molding process. The use of an injection molding process is detectable on the finished plastic conductor component; the insert part for example at least partially, preferably completely, borders directly on the plastic housing and/or is at least partially, preferably completely, embedded in the plastic housing.

Alternatively or in addition, it is possible that the plastic housing is separately produced, for example by an injection molding process. The plastic housing can be formed in such a way that the insert part and the driver component and/or the light-emitting diode chip, as well as optional further driver module components or lighting element components, are retained and fixed by the plastic housing. For example, the plastic housing has indentations and/or cutouts therefor.

The indentations or cutouts in combination with an electrical contact between the lighting elements, in particular by the insert part, can be provided by means of a two-component injection molding process. An electrically insulating part of the housing can be provided as the first component, while the electrically conductive plastic part can be used as second part. The electrically conductive plastic can, for example, take on the mechanical and/or electrical contacting of the component, in particular in the recesses of the holder of the component and/or between the recesses and the lighting elements.

Plastic conductor components are distinguished by their good electrical insulation, in particular by the plastic housing, and a compact construction. Moreover, the plastic housing offers a mechanical protective function for the insert part, the driver component and/or the light-emitting diode chip. In contrast to conventional printed conductive tracks, the insert part which serves for electrical contacting can also have three-dimensional structures. Thus, the position of electronic components in the plastic conductor component can be chosen more freely. Moreover, the use of an injection molding process, in particular also for electrical connection of the used components with the insert part, makes it possible not to use labor-intensive soldering processes.

According to at least one embodiment of the LED light fixture, the first printed circuit board of the lighting element is at least partially translucent or transparent. Thus, light emitted by the light-emitting diode chips is at most partially absorbed by the printed circuit board, so that a more uniform emission characteristic can be provided. In this case and in the following description, a translucent material transmits at most 60%, preferably at most 50% and particularly preferably at most 40%, and at least 30% of a light incident on the material. In this case and in the following description, a transparent material transmits at least 60%, preferably at least 80% and particularly preferably at least 90%, of the light incident on the material.

According to an embodiment of the LED light fixture the glass bulb has an opening which is closed by an at least partially, gas-permeable material. The glass bulb is, in particular, closed by the gas-permeable material in such a way that the air surrounding the glass bulb can penetrate through the material into the interior of the glass bulb and conversely gas present in the interior of the glass bulb passes through the material into the ambient air. An air or gas exchange in the interior of the glass bulb is made possible by a gas-permeable end of the glass bulb. As a result, volatile organic compounds emitted by the light-emitting diode chips and/or the driver component can be removed from the glass bulb.

An adhesive, a silicone and/or a plastic is preferably used as gas-permeable material. The gas-permeable material can have holes, so that the gas permeability can be further improved. However, it is also possible that glass and/or ceramic, in particular in each case in the porous state, can be used a gas-permeable material.

It is possible that the LED light fixture, in particular the glass bulb, has a plurality of openings. The openings can be at least partially round, in particular circular, and/or slot-like. In particular at least some of the openings, in particular all openings, have a diameter of at most 2 mm. The openings can be located in particular in the region of the glass bulb which takes on the function of a base of the LED light fixture, for example a G9 base.

The opening can be used, for example, in a production process of the LED light fixture for introduction of the lighting elements and the driver module into the interior of the glass bulb. If the glass bulb is filled with a heat-conducting gas, a top face of the glass bulb opposite the opening is preferably closed, in particular sealed in a gas-tight manner. A glass lug of the glass bulb through which the glass bulb can be filled with a gas can be located on the top face of the glass bulb. Otherwise it is possible that on the top face the glass bulb comprises at least one opening which can have a diameter of at most 2 mm. By the combination of an opening on the top face with an opening on the underside a good ventilation of the LED light fixture by convection can be guaranteed and volatile compounds can be effectively removed.

In closed glass bulbs in the case of LED light fixtures with light emitting diode chips and/or a driver component, the problem of gaseous emissions of volatile organic compounds (VOC) and/or volatile compounds containing sulfur, phosphorus and/or chlorine can increasingly occur. The volatile organic compounds can include, for example, oxygen, nitrogen, hydrogen and/or carbon. The volatile organic compounds and/or compounds containing sulfur, phosphorus and/or chlorine can also be generally designated below by "volatile compounds". The volatile compounds can originate, for example, from fluxing agent residues or solder resists from soldering processes. Furthermore, the volatile compositions can be outgassing of polymers of the light emitting diode chips or the driver component, glues and/or heat conducting pastes. Moreover, the volatile compounds can originate from an optionally provided printed circuit board.

Volatile compounds present in the glass bulb can be deposited on the material of the glass bulb where they lead to discolorations. This is known under the term "fogging" of the glass bulb and can lead to losses of luminous flux of up to 10%. The diffusion of the volatile organic compounds into a silicone shell which may be present on the light emitting diode chips is even more serious. As a result, hydrocarbon compounds in the silicone shell are broken up and the silicone can take on a dark color. This can lead to losses of luminous flux of over 50%. This loss of luminous flux is generally associated with an additional color location shift. These two phenomena are known under the terms "lumen degradation" and "change color chromaticity". Furthermore, compounds containing sulfur, phosphorus and/or chlorine can lead to reflection losses on a silver mirror which may be present below the emitting layers of the light emitting diode chips.

In at least one alternative or additional embodiment the interior of the glass bulb contains a getter material for binding (so-called degettering) of volatile compounds. The getter material is preferably introduced at least partially as gas into the glass bulb. The gaseous getter material is, for example, hydrogen-rich and/or oxygen-rich compounds, which in particular, bind volatile carbon-containing compounds and, for example, react to $CH_4$ or $CO/CO_2$. Due to the binding a reaction with a silicone shell and/or a deposition on the glass bulb can be prevented. In particular, the getter material can contain oxygen gas and/or a silane, for example a monosilane ($SiH_4$). In this case in the event of a high pressure inside the glass bulb the silane can be introduced into the glass bulb at a maximum concentration below an ignition limit or explosion limit. For example, the bulb can be filled with 8% by volume of silane. In particular, the quantity of gaseous getter material can be increased in direct proportion to the absolute pressure of a heat-conducting gas optionally introduced into the glass bulb.

Alternatively or in addition, the getter material can be introduced at least partially into the glass bulb as solid material. Solid getter material suitable, for example, is a pure metal, such as zirconium Zr, tantalum Ta, titanium Ti, palladium Pd, vanadium V, aluminum Al, copper Cu, silver Ag, magnesium Mg, nickel Ni, iron Fe, calcium Ca, strontium Sr and barium Ba. Also alloys of pure metals are suitable as solid getter material, such as for example ZrAl, ZrTi, ZrFe, ZrNi, ZrPd and/or $BaAl_4$. In this case, the use of a ZrAl alloy is preferred. Furthermore, oxides and hydrides of pure metal are suitable as getter material. Metal hydroxides, such as for example magnesium hydroxide or aluminum hydroxide, may be considered, in particular, as solid getter materials inside the glass bulb. Metal hydroxides are suitable, for example, for degettering of volatile carbon compounds in the closed volume of the glass bulb.

Solid getter materials are preferably applied so that they have a large reactive surface, such as for example as a coating and/or as sintering material. Alternatively or in addition, the getter material can be introduced into the glass bulb as solid metal, for example in wire form.

In this connection it is possible that solid getter materials are optimized with regard to their getter behavior by additionally introduced gaseous getters. For example, the getter materials can be activated after a pumping operation and firing in the furnace (tempering). As a result, for example, reactive oxides of metallic getter materials can form.

According to one embodiment of the LED light fixture, the interior space of the glass bulb is filled with a heat-conducting gas. A heat-conducting gas is understood to be a gas which conducts heat well. In particular, a heat-conducting gas can have a higher thermal conductivity than air. Thus, at room temperature, that is to say at the reference temperature of 20° C. (293.15 K), a heat-conducting gas can have a thermal conductivity of at least 0.05 W/mK, preferably at least 0.10 W/mK and particularly preferably at least 0.13 W/mK. Helium gas (thermal conductivity 0.16 W/mK) and/or hydrogen gas (thermal conductivity 0.18 W/mK), for example, are suitable as heat-conducting gas. Furthermore, a mixture of helium with oxygen may be considered as heat-conducting gas; gas emissions from the lighting element and/or the driver module can be oxidized in particular by means of oxygen, so that these emissions can likewise be removed from the atmosphere in the glass bulb. The absolute pressure of the heat-conducting gas in the interior space can be up to 10 bars, preferably at most 5 bars. The absolute pressure is at least 1 bar. The details of the absolute pressure should be understood to relate to room temperature. The use of a high pressure, heat-conducting gas enables an improved heat removal inside the LED light fixture.

If the glass bulb is filled with a heat-conducting gas, the glass bulb is preferably gas-tight and/or vacuum sealed. In other words, the glass bulb can be closed and/or fused in such a way that the absolute pressure inside the glass bulb is maintained without external devices, such as for example vacuum pumps. Thus, the glass bulb can enclose a sealed or self-contained volume which forms the interior space.

The opening is preferably located on an underside of the glass bulb which has a retainer for the lighting elements and the driver module. The retainer can, in particular, correspond to electrical connectors for electrical contacting of the lighting elements and of the driver module 3. The electrical connectors can be, for example, wire pins. The wire pins can be retained in the gas-permeable material. Alternatively, the wire pins can be fused with the glass bulb. For electrical contacting of the lighting element from the exterior, the electrical connectors can be connected by means of an electrically conductive connection region to contact pins arranged at least partially outside the glass bulb.

If the glass bulb has no opening with a gas-permeable material, the connection region can be fused or welded to the glass bulb. The fusion can take place, in particular, in such a way that the glass bulb is vacuum sealed. For example, a molybdenum film and/or a molybdenum wire is attached between the glass bulb and the connection region, in particular in a fusion region of the connector, in order thus to simplify the fusion. The molybdenum film or the molybdenum wire is formed with molybdenum or consists of molybdenum. Furthermore, the molybdenum film or the molybdenum wire can contain a getter material, for example in the form of a coating.

In the case of a quartz glass bulb a molybdenum film is preferably used and in the case of a tempered glass bulb a molybdenum wire is preferred. This is due to different coefficients of thermal expansion of quartz glass and tempered glass. Thus, the thermal coefficient of expansion of molybdenum is $5.1 \cdot 10^{-6}$ $K^{-1}$, of quartz glass $0.6 \cdot 10^{-6}$ $K^{-1}$ and of tempered glass $4.7 \cdot 10^{-6}$ $K^{-1}$. Thus, tempered glass has a similar coefficient of thermal expansion to molybdenum (the difference is less than 10%), and for this reason in contrast to quartz glass a direct fusion is possible. Alternatively, in the case of tempered glass a wire with an iron-nickel-cobalt alloy (so-called KOVAR) and/or a tungsten wire can be used.

In one embodiment the lighting elements border at least partially directly on the glass bulb and/or are thermally conductively connected to the glass bulb. In particular, the lighting elements bear against an inner wall of the glass bulb and/or a material, of which the thermal conductivity is at least 80% of the thermal conductivity of the material of the glass bulb, is applied between the lighting elements and the inner wall of the glass bulb. As a result, the heat removal from the lighting elements via the glass of the glass bulb can be improved.

The lighting elements are preferably resiliently retained; that is to say, the position of the lighting element, in particular transversely with respect to the main axis, can be changed non-destructively within a tolerance of the mounting. The resilient mounting takes place, in particular, with a resilient element. A resilient element can ensure that the lighting elements can be introduced into the glass bulb and after the introduction can bear against the inner wall of the glass bulb. During the introduction, the lighting elements are, for example, pressed in the direction of the internally located driver module. After the introduction, a restoring force of the resilient element can enable the lighting elements to be moved in the direction of the inner wall of the glass bulb and away from the driver module. Since the driver module then no longer directly borders the lighting elements, such an arrangement additionally enables a more efficient light output from the lighting elements.

The resilient element is preferably integrated in the holder, in particular in the recess in the holder, of the lighting element. As a result, it is possible to compensate for the different coefficients of thermal expansion between the materials of the glass bulb, the holder and the lighting elements.

According to one embodiment of the LED light fixture, the glass bulb is spaced apart from the lighting elements. The glass bulb is then, in particular, a glass shell construction. In this embodiment, the lighting elements preferably do not border directly on the glass bulb. A gas, in particular a heat-conducting gas, is for example located between the glass bulb and the lighting elements. In this embodiment, the lighting elements can be thermally connected to the glass bulb merely by means of the gas.

According to an embodiment of the LED light fixture the driver module is introduced into a prismatic or cylindrical tube and the lighting elements are arranged outside the tube. The tube is preferably rotationally symmetrical. The tube can be formed with glass and/or a ceramic. The tube is preferably translucent or opaque. In this way it is possible additionally to conceal the driver module. Moreover, the tube can be constructed to mechanically stabilize the driver module. For this purpose, for example the driver module borders at least partially directly on an inner face of the tube.

In this case and in the following description an opaque material transmits at most 30%, preferably at most 20% and particularly preferably at most 10%, and at least 30% of a light incident on the material. The opaque material can be a light-absorbent material (i.e. a material which absorbs at least 50%, preferably at least 70% and particularly preferably at least 90%, of the light incident on the material) or, preferably a light-reflecting material (i.e. a material which reflects at least 50%, preferably at least 70% and particularly preferably at least 90%, of the on the light incident on the material).

In a preferred embodiment, the tube has the shape of a regular prism and the light-emitting diode chips of the lighting elements are mounted directly on lateral surfaces of the prism. Thus, the tube can form a substrate for the light-emitting diode chips.

A conventional, two-dimensional assembly process can be used in conjunction with a rotary production process for fitting the light-emitting diode chips on the tube. In this case the light-emitting diode chips are first mounted on a lateral surface of the prism by a conventional assembly machine which enables assembly in the x-y plane. Next, the prism is rotated about its axis of rotation in such a way that a lateral surface adjacent to the lateral surface which is already equipped is located in the x-y plane. The adjacent lateral surface is then likewise equipped. These steps are repeated until all the lateral surfaces are equipped. With a conventional two-dimensional assembly process, a three-dimensional assembly can be achieved using this method.

According to at least one embodiment of the LED light fixture, the driver module has a driver component embedded in a gas-impermeable potting material. The potting material can be transparent. The potting material is preferably translucent or opaque, so that the driver module is not directly discernible from the exterior. For example, the potting material is formed with a silicone, polyurethane or an epoxy resin. In particular, epoxy resins have an advantage that volatile compounds emitted by the driver component cannot diffuse or can only diffuse to a small extent through the epoxy resin. The potting material preferably has a low gas emission rate.

According to at least one embodiment of the LED light fixture, the tube and/or the potting material is designed to be light-reflecting on at least one outer face which faces the lighting elements. Thus, light emitted by the light-emitting diode chips of the lighting elements is reflected back by the tube and/or the potting material. As a result, on the one hand, a light yield of the LED light fixture can be increased and, on the other hand, the driver module introduced into the tube and/or the potting material is removed from direct view.

According to at least one embodiment of the LED light fixture, this light fixture has a conversion element with a wavelength conversion material. In this case, in operation, the light-emitting diode chips preferably emit blue light, which is converted at least partially into lower-energy light by means of the conversion element, so that in operation the LED light fixture emits white light. The conversion element can be provided as a phosphorus layer separated from the lighting elements (so-called "remote phosphor"). Alternatively or in addition, the wavelength conversion material can have a quantum dot conversion material.

In the case of a remote phosphor conversion element, this element can be mounted, for example on the glass bulb, and in particular, on an inner face of the glass bulb facing the interior. For this purpose, the conversion element is preferably applied as a layer to the material of the glass bulb, in particular by means of a coating and/or vapor deposition process.

In a special embodiment, the conversion material is introduced into an intermediate space between the glass bulb and the lighting elements. In this case, the phosphorus is mixed into a silicone potting and introduced into the LED light fixture. In order to save on expensive silicone phosphorus potting material, transparent fillers can also be added (such as for example glass beads).

In particular, the light-emitting diodes of the lighting elements can in each case have a transparent and/or translucent clear silicone lens. By the combination of blue emitting light-emitting diodes with a clear silicone lens with a remote phosphor, it is possible to avoid a color shift, which is usually produced in potting consisting of conversion material (so-called silicone potting color shift).

Alternatively or in addition, it is possible that the conversion element is applied to an outer face of the glass bulb. In this case the LED light fixture is preferably part of a LED lamp with an enclosure into which the LED light fixture is introduce. The enclosure then protects the conversion element applied to the outer face of the glass bulb against mechanical damage. Alternatively or in addition, the conversion element can be covered with a mechanically protective coating. It is further possible that the conversion element is applied, for example as a layer, to an inner surface of the enclosure facing the glass bulb. Furthermore, alternatively or in addition, it is possible that the remote phosphor conversion element is constructed as a polymer bulb.

Also, in the version with a remote polymer bulb the intermediate space between the lighting elements can be filled with silicone in order to further improve the heat discharge away from the lighting elements.

In the case of a quantum dot conversion material the conversion material is preferably provided in the form of a coating and/or as a film. The coating and/or the film can be applied directly to the light-emitting diode chips of the lighting element and/or can be present as remote phosphor. In the case of a film a quantum dot film free of cadmium and heavy metal is preferably used, in particular a CFQD film from Nanoco.

Alternatively, the quantum dot conversion material and/or narrow-band phosphor conversion materials can be introduced into a matrix material, such as for example a silicone potting, wherein the matrix material is applied directly to the light-emitting diode chips.

In this case and in the following description a "quantum dot" is a structure which has an expansion in the sub-micrometer range. Sometimes because of the small expansion of the quantum dot the power levels thereof are quantized or discrete. In particular, an average expansion of a quantum dot is at most 100 nm, preferably at most 20 nm and particularly preferably at most 10 nm, and the quantum dot has at least an average expansion of 1 nm, preferably at least 2 nm and particularly preferably at least 5 nm. The quantum dots can comprise one of a plurality of layers of encapsulating semiconductor core, in particular with a compound semiconductor material which has wavelength-converting characteristics. Quantum dot conversion materials have the advantage that, with regard to, their wavelength-converting characteristics they can be adjusted in a targeted manner by a corresponding choice of the semiconductor material and/or the size of the quantum dots. For example, a spectral distribution of the emission characteristic of quantum dots can have a small full width at half maximum (FWHM), in particular at most 50 nm, preferably at most 25 nm. In this case the peak wavelength can be adjusted precisely up to +/−5 nm, preferably up to +/−1 nm. Moreover, the conversion efficiency of a quantum dot conversion material is substantially higher than that of a regular conversion material, for example a luminescent material.

According to an embodiment of the LED light fixture, the conversion element, in particular the phosphor layer, is provided as a polymer bulb. A polymer bulb is an enveloping bulb, which can have a similar or the same shape as a halogen lamp bulb. The wavelength conversion material of the conversion element is preferably introduced into a polymer of the polymer bulb. The polymer can be provided in the form of a bulb encasing the lighting elements. In particular the polymer bulb is arranged inside the glass bulb. The glass bulb is then preferably constructed as a glass shell.

According to at least one embodiment of the LED light fixture, the driver module has a smoothing capacitor, and/or the wavelength conversion material has a decomposition time of at least 1 ms, preferably at least 5 ms and particularly preferably at least 10 ms. The previously mentioned 100 Hz flickering is reduced on the basis of the modulation of the input voltage both by a smoothing capacitor and also with a high decomposition time.

The smoothing capacitor is preferably connected in parallel to the light-emitting diode chips of the lighting elements. An energy accumulator is introduced into the system by the smoothing capacitor. As a result, flickering (also referred to as light flicker), in particular the 100 Hz flickering, of the light emitted by the at least one light emitting diode chip can be substantially reduced or even completely prevented and so the emission characteristic can be significantly improved. The smoothing capacitor is an electrolyte capacitor and/or a ceramic capacitance.

The decomposition time of the wavelength conversion material can be an intrinsic characteristic of the wavelength conversion material, for example, on the basis of a decay constant of a stimulated energy state of the wavelength conversion material. Alternatively or in addition, photoluminescent components, in particular photoluminescent phosphors, can be built into the wavelength conversion material. A long decomposition time likewise makes it possible to reduce flickering of the LED light fixture.

Furthermore, a LED lamp is specified. The LED lamp comprises a LED light fixture. The LED light fixture of the LED lamp can preferably be a previously described LED light fixture. In other words, all features disclosed for the LED light fixture are also disclosed for the LED lamp, and vice versa. The LED lamp can be, for example, a LED retrofit lamp or a LED luminaire.

The LED lamp comprises an enclosure and a LED light fixture arranged inside the enclosure. The LED light fixture comprises a glass bulb, in the interior of which a plurality of lighting elements are received. The glass bulb completely surrounds the lighting elements radially. Furthermore, the lighting elements are arranged radially around a central region of the LED light fixture.

The central region preferably contains a central axis of the LED light fixture in the radial direction. The central region preferably contains a driver module and/or is located at the site at which the driver module is located in the case of the LED light fixture described above. Thus, the above disclosure of the position of individual components of the LED light fixture in relation to the driver module is also disclosed for the central region.

The enclosure can be a glass shell and/or an at least partially transparent housing. The glass shell is preferably formed with or made from a soft glass, in particular soda-lime glass. Soft glass is characterized by its low production costs and easy workability. In particular, the enclosure is formed with a material which has a high thermal conductivity which, in particular, corresponds at least to the thermal conductivity of quartz glass.

Alternatively or in addition, the enclosure can comprise a reflector which is reflective for the light emitted by the LED light fixture. The LED lamp can then be designed, in particular, as a retrofit for a conventional halogen reflector lamp.

According to an embodiment of the LED lamp a heat-conducting gas can be located in an intermediate space between the glass shell and the glass bulb. The pressure of the heat-conducting gas inside the glass shell is preferably lower than the pressure of the heat-conducting gas inside the glass bulb. Alternatively or in addition, a heat-conducting material, such as for example a silicone encapsulation and/or glass diffusers, can be introduced into the intermediate space between the glass bulb and the enclosure.

According to an embodiment of the LED element, a driver module is received in the interior of the glass bulb and the lighting elements are arranged radially around the driver module. In other words, the LED lamp comprises a previously described LED light fixture according to the invention with a driver module.

According to an embodiment, the LED lamp has a base for electrically contacting the LED lamp and/or for introducing the LED lamp into a lamp socket. The base is preferably a screw base, such as for example a E27, E14 or B22d base. The base contains a wireless module and/or a sensor unit. The wireless module is, for example, configured in order to transmit data to an external control unit, in particular wirelessly, and/or to receive data from the external control unit, in particular wirelessly. The external controller is for example a computer, in particular a portable computer, such as a laptop, a tablet PC or a smartphone. The sensor unit can serve for detecting environment data, in particular an ambient brightness. By means of the wireless module and/or the sensor unit the LED lamp can for example be programmed and/or can react to a change in the light conditions. In this case the LED lamp is suitable in particular for so-called smart light applications.

Preferred further embodiments of the invention are explained in greater detail by the following description of the drawings.

FIGS. 1A, 1B, 10, 2A, 2B, 2C, 2D, 3A, 3B, 3C, 3D, 3E, 3F, 3G and 3H show exemplary embodiments of a LED light fixture described here.

FIGS. 5A, 5B, 5C, 5D, 5E, 5F, 5G 6A and 6B show exemplary embodiments of a LED lamp described here.

Figure 7A:
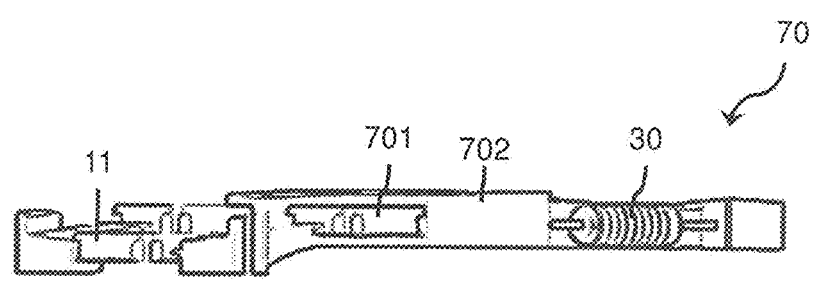
Figure 7B:
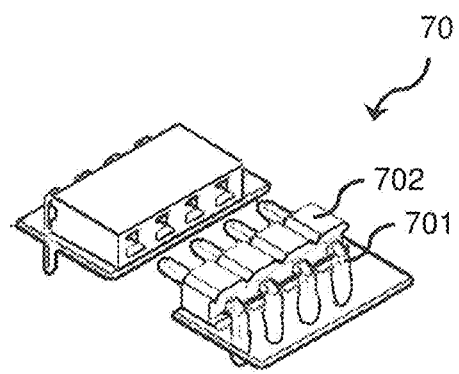

FIGS. 7A and 7B show exemplary embodiments of plastic conductor components for a LED light fixture described here.

DETAILED DESCRIPTION OF PREFERRED EXEMPLARY EMBODIMENTS

The light fixture described here as well as the spring contact described here are explained in greater detail below with reference to exemplary embodiments and the associated drawings. In this case elements which are the same, of the same kind, similar or equivalent are provided with the same reference numerals. Repeated description of some of these elements is omitted in order to avoid redundancies.

The drawings and the size ratios of the elements illustrated in the drawings elements should not be regarded as drawn to scale relative to one another. On the contrary, individual elements may be shown as excessively large for better illustration and/or to aid understanding.

Figure 1A:
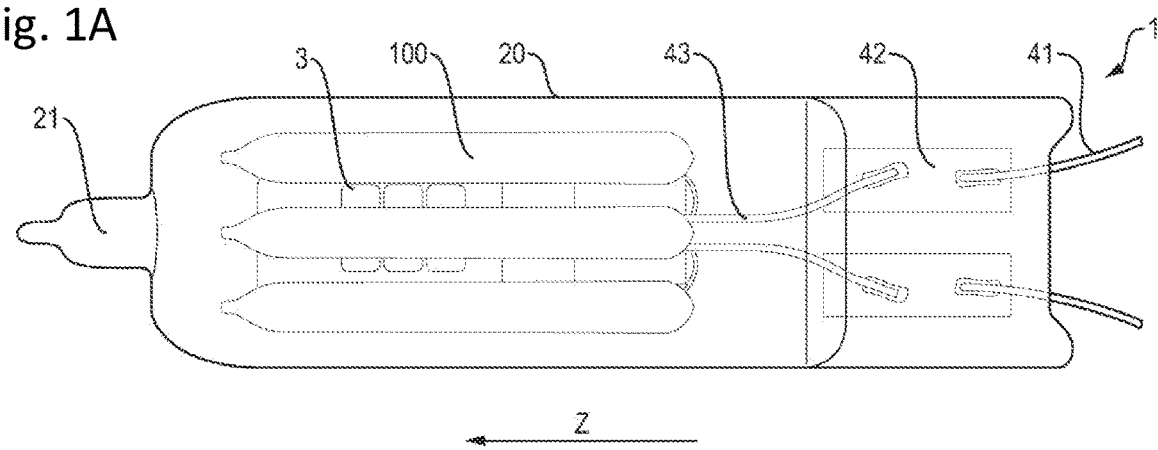
Figure 1B:
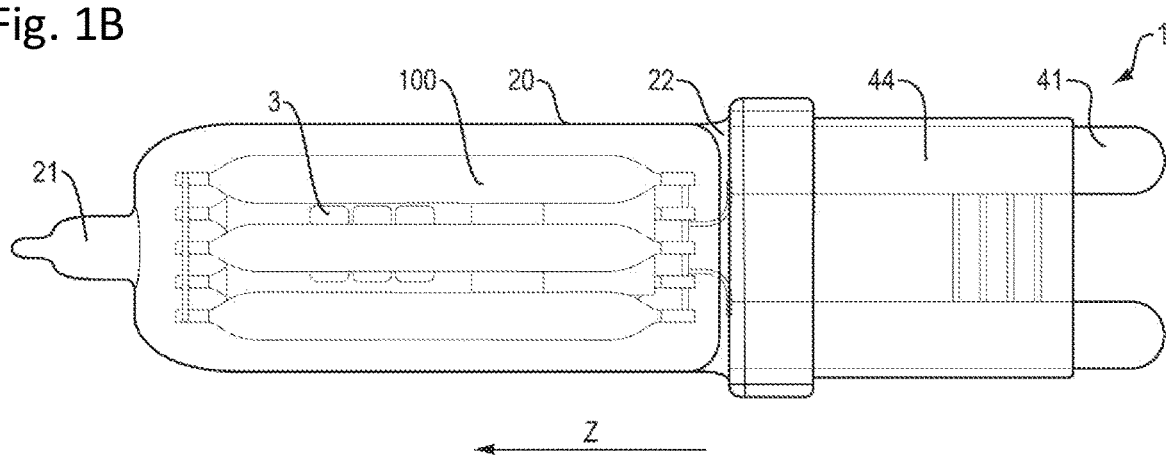

Exemplary embodiments of a LED light fixture 1 described here is explained in greater detail with reference to the schematic illustrations in FIGS. 1A, 1B and 10. FIG. 1A shows a first exemplary embodiment, wherein the glass bulb 20 of the LED light fixture 1 is vacuum-sealed. FIGS. 1B and 10 show a second exemplary embodiment in a front view (FIG. 1B) and a side view (FIG. 10), wherein the glass bulb 20 is not vacuum-sealed.

The LED light fixture 1 of FIGS. 1A to 10 in each case comprise a glass bulb 20 which extends along a main axis z and in the interior of which a plurality of lighting elements 100 are introduced. The lighting elements 100 are arranged radially around a driver module 3 and at least partially mask the direct view of the driver module 3. Each lighting element 100 comprises a plurality of light-emitting diode chips 11 (not visible in FIGS. 1A to 10).

On the top face the glass bulb 20 has a protuberance 21 in each case. The protuberance 21 is arranged on an axis of symmetry of the glass bulb 20. The protuberance 21 can be the glass lug which is known from conventional halogen lamps and can serve for filling of the glass bulb 20 with a heat-conducting gas. It is possible that the lighting elements 100 are centered by means of the protuberance 21. For this purpose, for example, the lighting elements 100 protrude at least partially into the protuberance 21 and/or are at least fixed partially inside the protuberance 21. Due to the protuberance 21, the design of the LED light fixture 1 can be brought closer to that of a conventional halogen lamp, so that the aesthetics and the customer acceptance is increased.

The glass bulb 20 further comprises electrical connectors 43, which serve for electrical contacting of the lighting elements 100 and/or of the driver module 3. Contact pins 41 on an outer face of the glass bulb 20 enable electrical contacting from the exterior.

In the exemplary embodiment according to FIG. 1A, the electrical connectors 43 are electrically conductively connected to contact pins 41 by means of a connection region 42. A molybdenum film is located in the connection region 42, and when this film is used it is possible to compensate for a different thermal coefficient of expansion of the material of the electrical connectors 43 or the contact pins 41 and the material of the glass bulb 20. In particular, in the illustrated example the glass bulb 20 can be formed with quartz glass. Alternatively, in the case of tempered glass it is possible that the connection region 42 merely comprises a wire, for example a molybdenum wire, a tungsten wire or an iron-nickel-cobalt wire, since with tempered glass in conjunction with the said electrically conductive materials no adaptation of the coefficients of thermal expansion is necessary.

Figure 1C:
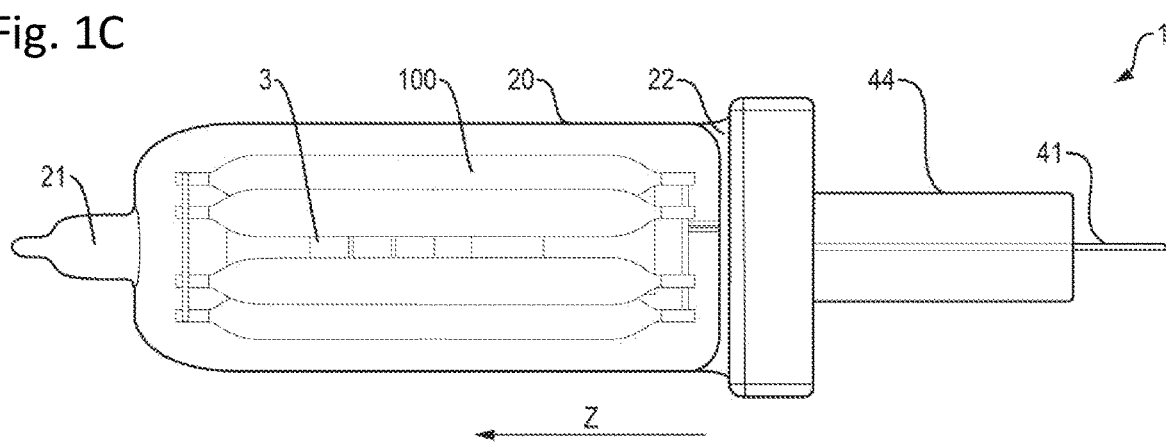

In the exemplary embodiment according to FIGS. 1B and 1C a gas-permeable material 44 closes an opening 22 of the glass bulb 20. The opening 22 is located in the region of the electrical connectors 43 and the contact pins 41. In the exemplary embodiment according to FIGS. 1B and 10 the gas-permeable material 44 is a plastic housing. The electrical connectors 43 are connected by the gas-permeable material 44 directly to the contact pins 41.

Further exemplary embodiments of a LED light fixture 1 described here is explained in greater detail with reference to the schematic illustrations in FIGS. 2A, 2B, 2C and 2D. In each case schematic sketches of different embodiments of a LED light fixture 1 are shown.

Figure 2A:
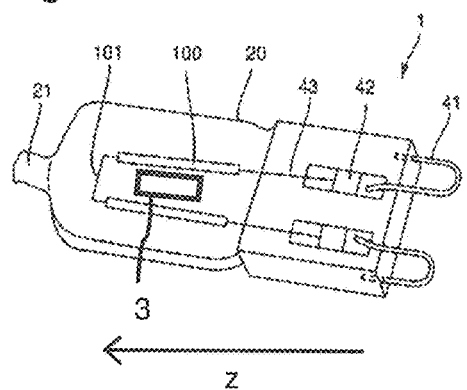
Figure 2B:
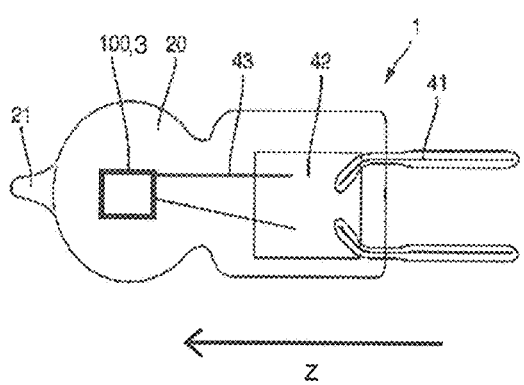
Figure 2C:
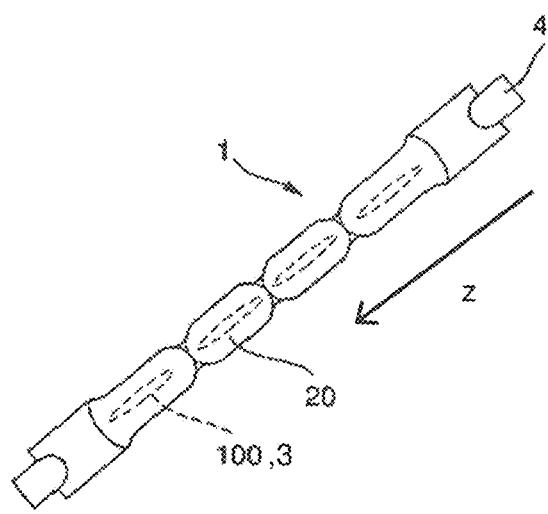
Figure 2D:
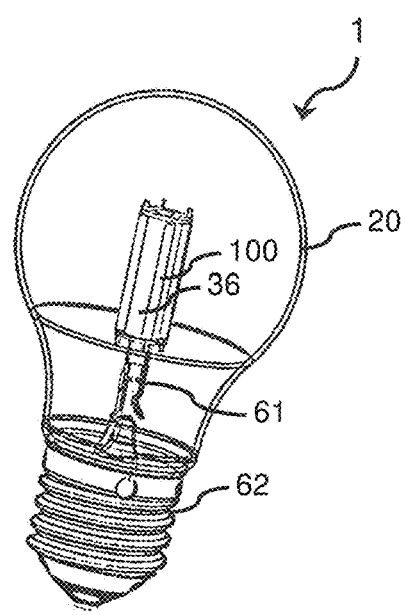

Each of the LED light fixtures 1 according to FIGS. 2A, 2B and 2C comprises at least one lighting element 100, which is introduced jointly with a driver module 3 into a glass bulb 20. Electrical connectors 43 and contact pins 41 serve for electrical contacting of the lighting elements 100 and of the driver module 3.

The LED light fixture 1 according to FIG. 2A has, purely by way of example, two lighting elements 100 which are electrically connected to one another at their long ends 101. However, unlike the illustration in FIG. 2A, the LED light fixture 1 can also have more lighting elements 100 which are in each case connected to one another at their long ends 101. The LED light fixture 1 according to FIG. 2A can be used for example in a so-called pin-base lamp, in particular a G9 pin-base lamp which can be operated at 230 V.

The LED light fixture 1 according to FIG. 2B can likewise be used in a pin-base lamp, in particular a G4 pin-base lamp which can be operated at 12 V. The LED light fixture 1 according to FIG. 2B differs from the LED light fixture 1 of FIG. 2A, in particular, by a partially spherical structure of the glass bulb 20 and by a more pronounced protuberance 21. As a result, the LED light fixture 1 is even more is similar to a conventional halogen or incandescent lamp.

The LED light fixture 1 according to FIG. 2C has an elongated, rod-like shape. The illustrated LED light fixture 1 can be designed for example as a halogen tube lamp. In contrast to the LED light fixtures 1 according to FIGS. 2A to 2B, in which the contact pins 41 were arranged on the same side of the glass bulb 20, the contact pins 41 are now arranged on opposite sides of the glass bulb 20.

The glass bulb 20 of the LED light fixture 1 is constructed as a glass shell which is spaced apart from the lighting elements 100 of the LED light fixture 1. The lighting elements 100 are mounted on a tube 36 which is connected by means of a mounting element 61 to a base 62 of the LED light fixture 1.

Exemplary embodiments of a LED light fixture 1 described here is explained in greater detail with reference to the schematic illustrations in FIGS. 3A, 3B, 3C, 3D, 3E, 3F, 3G and 3H.

Figure 3A:
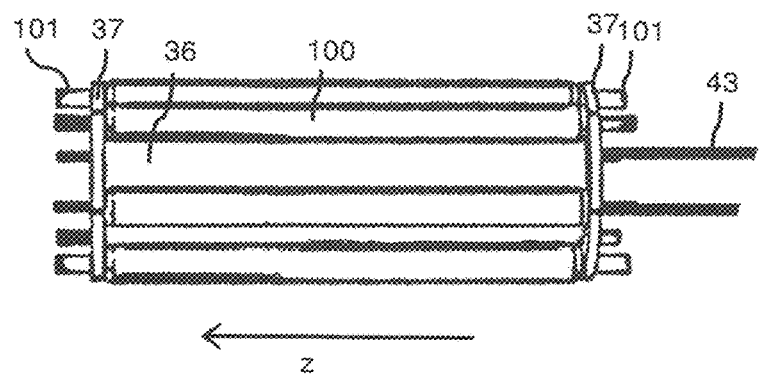

FIG. 3A shows a side view of the interior of the LED light fixture 1. A plurality of lighting elements 100 is mounted on a cylindrical tube 36. The driver module 3 can be introduced into the tube 36. The lighting elements 100 are distributed uniformly, that is to say with a constant spacing relative to one another and to an axis of symmetry of the tube 36, along an outer surface of the tube 36. The tube 36 extends along the main axis z of the glass bulb 20. A holder 37 which has recesses 371 for fastening of the lighting elements 100 is mounted in each case on the two long ends 101 of the lighting elements 100.

Figure 3B:
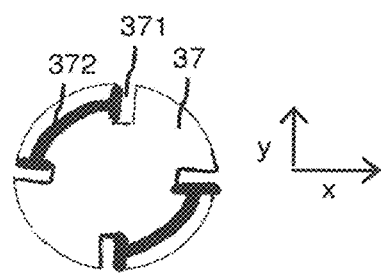
Figure 3C:
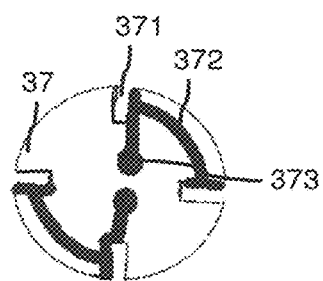

FIGS. 3B and 3C show a plan view of the holder 37. The plan view shows the lateral directions x, y of the LED light fixture 1 lying perpendicularly with respect to the main axis z; the lateral directions x, y span the radial direction. Each holder 37 comprises recesses 371, in which the long ends 101 of the lighting elements 100 can be retained. Two adjacent recesses 371 are in each case electrically conductively connected to one another by means of wires 372. At contact points 373 the lighting elements 100 retained in the holder 37 can be electrically contacted, for example by means of the electrical connectors 43.

It is possible that the holder 37 according to FIG. 3B corresponds to the left holder 37 according to FIG. 3A and the holder 37 according to FIG. 3C corresponds to the right holder 37 according to FIG. 3A. The contact points 373 of the holder according to FIG. 3C can then be electrically conductively connected to the electrical connectors 43 of the LED light fixture 1. The position of the wires 371 of the holder 37 according to FIG. 3C is arranged offset with respect to the position of the wires 371 of the holder 37. In other words, adjacent recesses 371, which are electrically conductively connected to one another on the holder 37 according to FIG. 3B are not electrically conductively connected to one another and vice versa in the holder 37 according to FIG. 3C. As a result, a series connection of the lighting elements 100 retained by the holders 37 is produced.

Figure 3D:
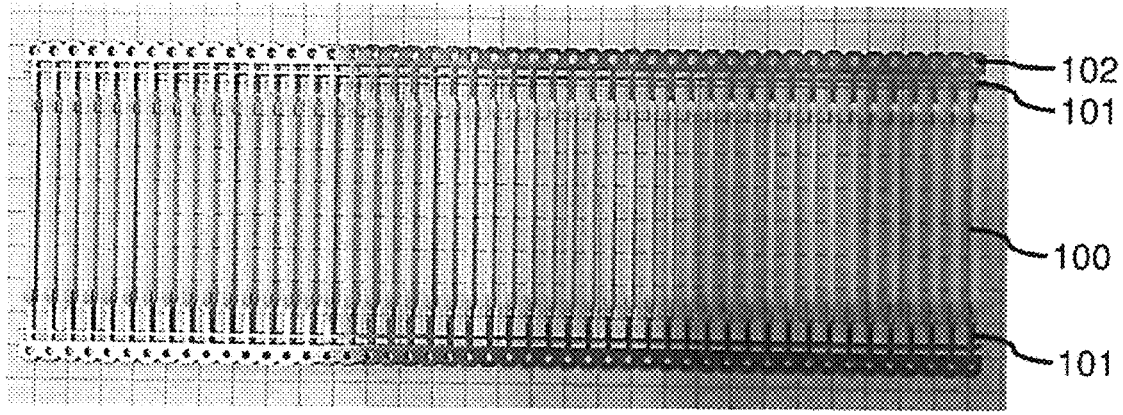
Figure 3E:
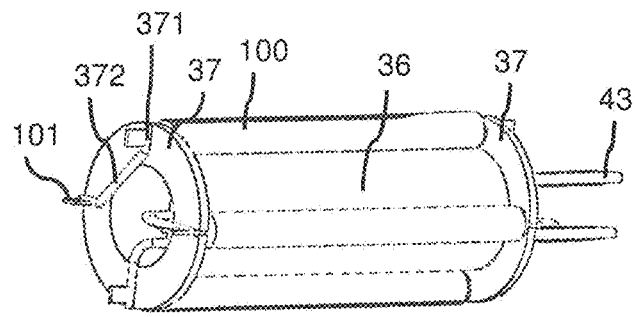
Figure 3F:
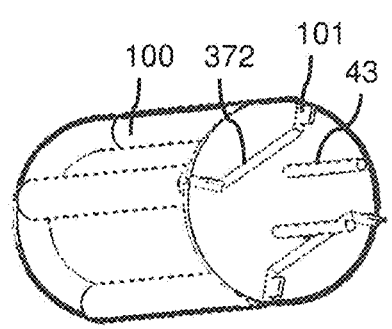
Figure 3G:
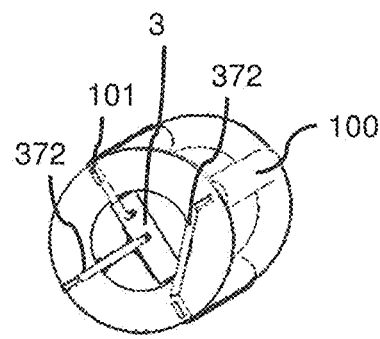
Figure 3H:
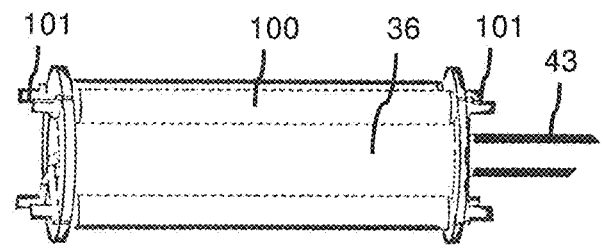

FIG. 3D shows exemplary embodiments of lighting elements 100 before they are installed in a LED light fixture 1. In the case of FIG. 3D, the lighting elements 100 are LED filaments. The lighting elements 100 are lined up and provided and connected to one another by a connecting element 102.

FIGS. 3E, 3F, 3G and 3H show an exemplary embodiment of a LED light fixture 1 in different perspectives. The LED light fixture 1 is similar to that shown in FIGS. 3A, 3B and 3C. The LED light fixture 1 comprises a plurality of lighting elements 100, which are mounted on a tube 36 and are retained in recesses 371 of holders 37. The recesses 371 or the long ends 101 of the lighting elements 100 received in the recesses 371 are electrically conductively connected by means of wires 372. In the FIG. 3G it can be seen that the lighting elements 100 are also partially electrically conductively connected to a driver module 3 arranged inside the tube 36 by means of the wires 372.

Figure 4A:
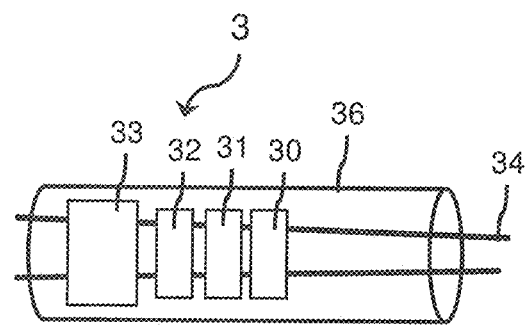
FIGS. 4A and 4B show exemplary embodiments of a driver module of a LED light fixture described here.

Exemplary embodiments of a driver module 3 for a LED light fixture 1 described here are explained in greater detail with reference to the schematic illustrations in FIGS. 4A and 4B. The driver module 3 comprises a plurality of electronic driver components 30, 31, 32 which are electrically conductively connected to one another by means of a connecting part 34. The driver module 3 is introduced into a tube 36. The tube 36 is, for example, translucent or opaque. The lighting elements 100 of the LED light fixture 1 are arranged on the tube 36 and/or around the tube 36.

Figure 4B:
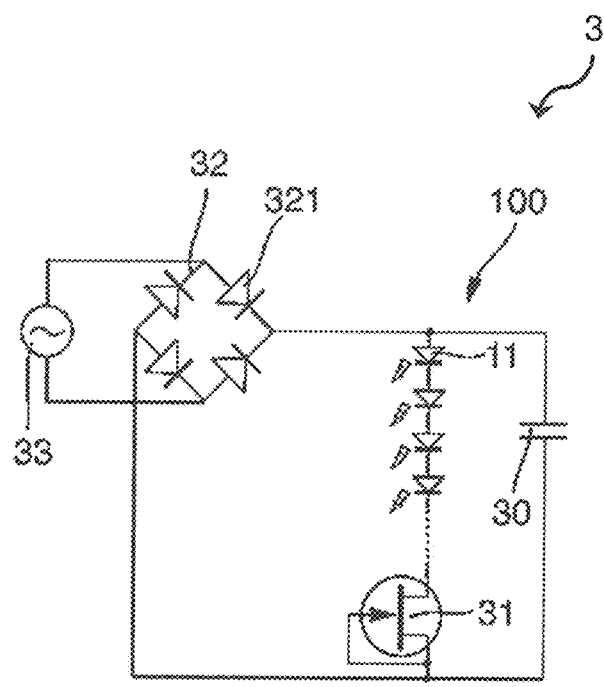

FIG. 4B shows an exemplary circuit diagram of a lighting element 100 for a LED light fixture 1 described here. The lighting element 100 comprises a plurality of light-emitting diode chips 11. The light emitting diode chips 11 are series-connected to a transistor 31. The transistor 31 can serve, for example, for setting a current through the series-connected light emitting diode chips 11. A smoothing capacitor 30 is parallel-connected to the light emitting diode chips 11. The smoothing capacitor 30 serves for filtering voltage modulations, in particular at 100 Hz, in the operating voltage of the light emitting diode chips 11. The operating voltage is provided by a voltage source 33. Between the voltage source 33 and the light emitting diode chip 11 is located a rectifier circuit 32, which in the present case is formed with four diodes 321. The rectifier circuit 32 and the transistor 31 can be part of an electronic driver, which can be mounted inside the glass bulb 20 of the LED light fixture 1. The smoothing capacitor 30, the transistor 31 and/or the rectifier circuit 32 can be part of a driver module 3 of the LED light fixture 1.

It is, in particular, possible that a plurality of lighting elements 100 are connected in parallel to one single smoothing capacitor 30 of the driver module 3 and/or are connected in series to one single rectifier circuit 32 of the driver module 3.

Exemplary embodiments of a LED lamp described here is explained in greater detail with reference to the schematic illustrations in FIGS. 5A, 5B, 5C, 5D, 5E, 5F and 5G. The LED lamps are in each case designed as LED retrofit lamps. Each of the LED lamps comprises a LED light fixture 1 as well as an enclosure 60. Furthermore, in each case a base 62 is provided for introduction of the LED lamp into a lamp socket and for electrical contacting of the LED lamp.

Figure 5A:
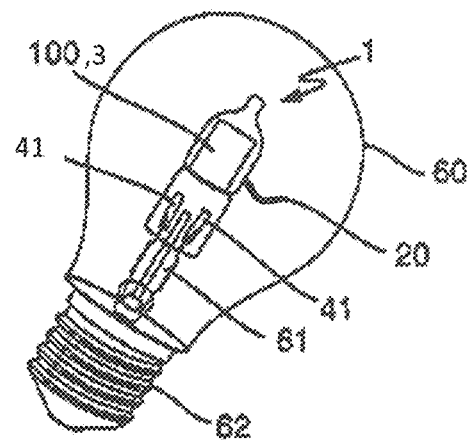

In the LED lamp of FIG. 5A the enclosure 60 is a glass shell which preferably corresponds to the glass shell of a conventional light bulb. In FIG. 5A the enclosure 60 is pear-shaped. Alternatively, the enclosure 60 can be cylindrical. A heat-conducting gas can be introduced between the enclosure 60 and the glass bulb 20 of the LED light fixture 1. The LED light fixture 1 is connected to the base 62 by means of two mounting elements 61, which in the illustrated example are mounting wires. The mounting elements 61 serve on the one hand to hold the LED light fixture 1 and on the other hand produce an electrically conductive connection between the base 62 and the contact pins 41 of the LED light fixture 1.

Figure 5B:
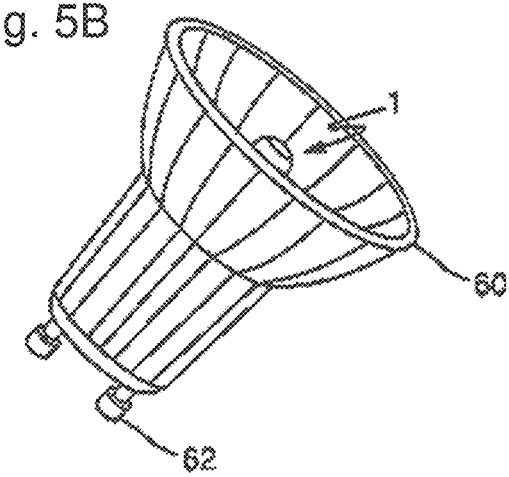
Figure 5C:
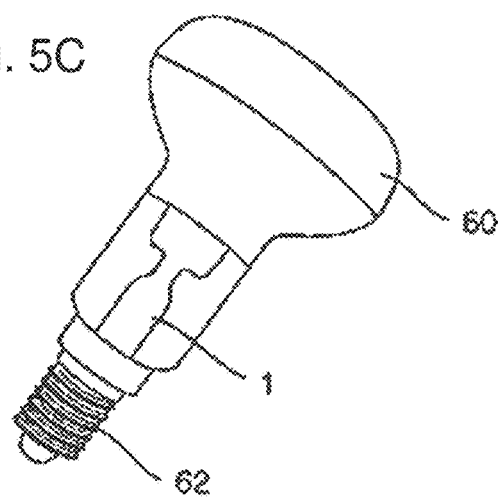

The LED lamp of FIG. 5B comprises an enclosure 60 which is designed as a reflector of a (halogen) reflector lamp. The LED light fixture 1 (not visible in FIG. 5B) is located in a cavity of the enclosure 60. The enclosure 60 of the LED lamp of FIG. 5C is formed with a glass shell which in part has a reflecting coating to form a reflector. The enclosure 60 of FIG. 5C is mushroom-like. The enclosures 60 of the LED lamps of FIGS. 5B and 5C can likewise contain a heat-conducting gas in an intermediate space between the enclosure 60 and the LED light fixture 1.

Figure 5D:
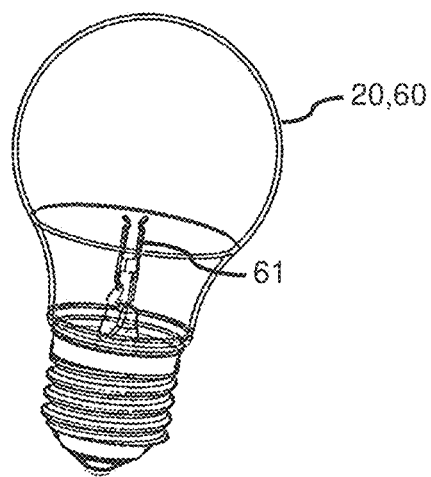
Figure 5E:
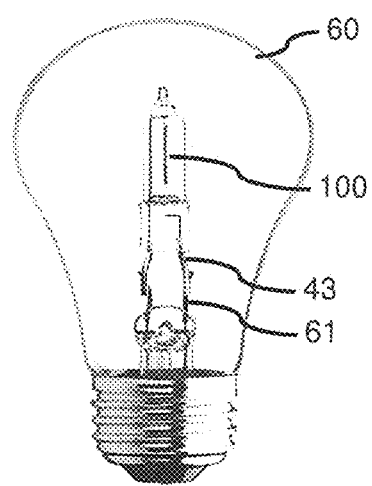

FIGS. 5D and 5E show different embodiments of a mounting element 61 for retention of a LED light fixture 1 in a LED lamp. Alternatively or in addition, the mounting elements 61 can also be present in a LED light fixture 1, in particular in the case of a glass bulb 20 constructed as a glass shell, for retaining the lighting elements 100. The mounting element 61 according to FIG. 5D is constructed as a clip, into which a LED light fixture 1 (or a lighting element 100) can be inserted. In FIG. 5E the mounting element 61 is constructed as a thick wire, to which the contact pins 41 of the LED light fixture 100 are soldered. Alternatively, for example contacts of the lighting elements 100 can be soldered to the mounting element 61.

In general, a mounting element 61 which is known from halogen lamps can be used as the mounting element 61. Instead of a halogen bulb, LED lighting elements 100 with an integrated driver module 3 are installed and connected to the base 62 of the lamp. The connection takes place, for example, by means of pump hose clip fitting, forked and/or L-shaped clips, or also by direct welding of thick current leads to the contact pins 41 of the LED light fixture 1.

Figure 5F:
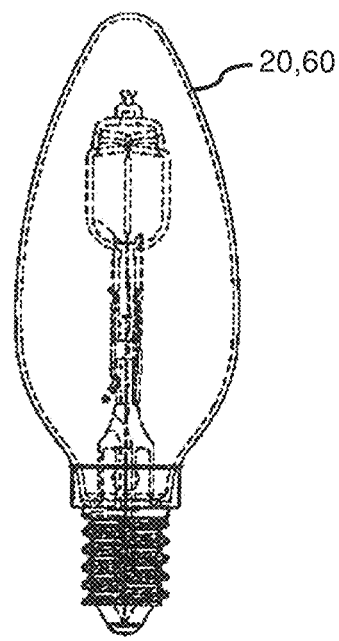
Figure 5G:
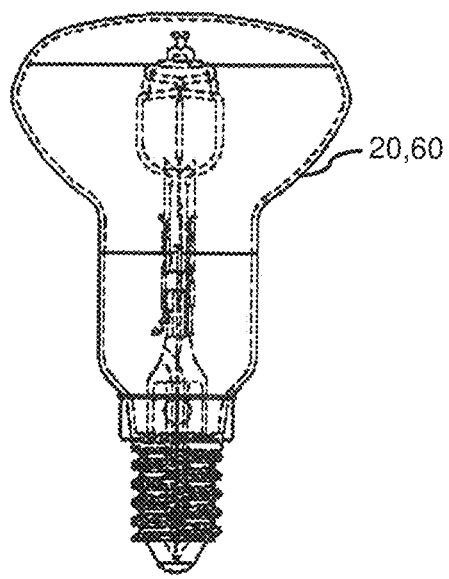

FIGS. 5F and 5G show different shapes of the enclosure 60. All the shapes for the enclosure 60 which are illustrated in FIGS. 5A to 5G can also be considered as a shape for the glass bulb 20, in particular if this is constructed as a glass shell. The enclosure 60 according to FIG. 5F is candle-shaped. The enclosure 60 of FIG. 5G is mushroom-shaped, similar to a halogen lamp (cf. also FIG. 5C).

Figure 6A:
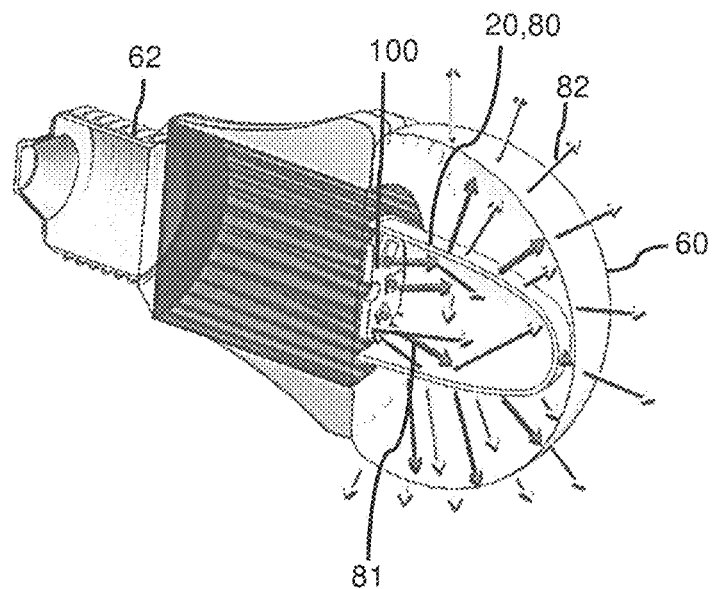

A further exemplary embodiment of a LED lamp described here is explained in greater detail with reference to the schematic sectional representation in FIG. 6A. The LED lamp comprises lighting elements 100 which jointly form a LED light fixture 1 and are introduced into a glass bulb 20. The LED light fixture 1 is introduced into an enclosure 60. The glass bulb 20 is coated with a conversion element 80. In this way the conversion element 80 is arranged spaced apart from the lighting element 100 and is present as remote phosphor. Unconverted light 81 emitted by the light-emitting diode chips 11 of the lighting elements 100 is partially converted by means of the conversion element 80 into more low-energy converted light 82.

Figure 6B:
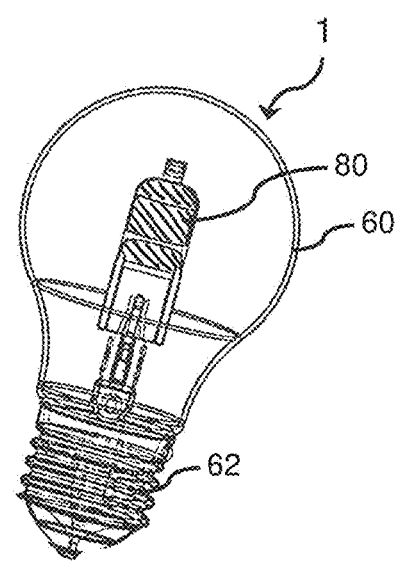

An exemplary embodiment of a light fixture 1 described here is explained in greater detail with reference to the schematic sectional representation in FIG. 6B. The LED light fixture 1 comprises a glass bulb 20 which is constructed as a glass shell and is arranged spaced apart from the lighting element 100. The lighting elements 100 are surrounded by a conversion element 80 constructed as a polymer bulb. This enveloping bulb 80 has the shape of a glass bulb of a G9 halogen lamp, with a diameter of approximately 13 mm and a length of approximately 44 mm. Due to this standardized shape the polymer bulb can be integrated without problems in conjunction with the lighting elements 100 into existing halogen classic production means (so-called bulbs having an A, B, P, G or R form).

Exemplary embodiments of a plastic conductor component 70 for a LED light fixture 1 described here are explained in greater detail with reference to the schematic illustrations in FIGS. 7A and 7B. Each plastic conductor component 70 has an electrically conductive insert part 701, which can be in particular a metal inner part, and an electrically insulating plastic housing 702, in which the insert part 701 is embedded. Alternatively or in addition, an electrically conductive plastic can be used as the insert part 701.

FIG. 7A also shows by way of example that a driver component 30, which is for example a smoothing capacitor 30, and/or a light-emitting diode chip 11 of the lighting element 100 can be embedded in the plastic housing 702.

A plug connection constructed as a plastic conductor component 70 is illustrated in FIG. 7B. The insert part 701 serves as an electrical connector, whilst the plastic housing 702 makes an electrical insulation possible.

The invention is not limited to these embodiments by the description with reference to the exemplary embodiments. On the contrary, the invention encompasses each new feature as well as any combination of features, in particular including any combination of features in the claims, even if this feature or this combination itself is not explicitly given in the claims or the exemplary embodiments.

LIST OF REFERENCES

1 LED light fixture
11 light emitting diode chip
100 lighting element
101 long end
102 connecting element
20 glass bulb
21 protuberance
22 opening
3 driver module
30 smoothing capacitor
31 transistor
32 rectifier circuit
321 diode
33 voltage source
36 tube
37 holder
371 recess
372 wire
373 contact points
41 contact pin
42 connection region
43 electrical connector
44 gas-permeable material
60 enclosure
61 mounting elements
62 base
70 plastic conductor component
701 insert part
702 plastic housing
80 conversion element
81 unconverted light
82 converted light
z main axis
x lateral directions

The invention claimed is:

1. A light-emitting diode (LED) lamp comprising:
an enclosure; and
an LED light fixture arranged inside the enclosure, the LED light fixture comprising a glass bulb, in an interior of which a driver module and a plurality of LED lighting elements are received, wherein the glass bulb completely radially surrounds the driver module and the LED lighting elements, wherein the LED lighting elements are arranged radially around the driver module and a central region of the LED light fixture, wherein the plurality of LED lighting elements comprises at least three LED lighting elements which extend along a main axis (z) of the glass bulb, and wherein the LED lighting elements form the edges of a regular, polygonal, imaginary prism which surrounds the driver module.

2. A light-emitting diode (LED) lamp comprising:
an enclosure;
an LED light fixture arranged inside the enclosure, the LED light fixture comprising a glass bulb, in an interior of which a driver module and a plurality of LED lighting elements are received, wherein the glass bulb completely radially surrounds the driver module and the LED lighting elements, wherein the LED lighting elements are arranged radially around the driver module and a central region of the LED light fixture; and
at least one disc-like holder having a plurality of recesses, wherein:
the plurality of LED lighting elements comprises at least four LED lighting elements, wherein each of the LED lighting elements is retained and electrically contacted on a long end of the LED lighting element in a respective recess; and
at least one of the recesses is electrically conductively connected to an adjacent recess.

3. A light-emitting diode (LED) lamp comprising:
an enclosure; and
an LED light fixture arranged inside the enclosure, the LED light fixture comprising a glass bulb, in an interior of which a driver module and a plurality of LED lighting elements are received, wherein the glass bulb completely radially surrounds the driver module and the LED lighting elements, wherein the LED lighting elements are arranged radially around the driver module and a central region of the LED light fixture, wherein the driver module is contained within a prism-like or cylindrical tube and the LED lighting elements are arranged outside the tube, and wherein the tube is designed to be light-reflecting on at least one outer face facing the lighting elements.

4. The LED lamp according to claim 3, further comprising a base configured for at least one of electrically contacting the LED lamp and introducing the LED lamp into a lamp socket, wherein the base contains at least one of a wireless module and a sensor unit.

5. The LED lamp according to claim 1, further comprising a base configured for at least one of electrically contacting the LED lamp and introducing the LED lamp into a lamp socket, wherein the base contains at least one of a wireless module and a sensor unit.

6. The LED lamp according to claim 2, further comprising a base configured for at least one of electrically contacting the LED lamp and introducing the LED lamp into a lamp socket, wherein the base contains at least one of a wireless module and a sensor unit.

* * * * *